United States Patent
Lei et al.

(10) Patent No.: US 9,935,069 B2
(45) Date of Patent: Apr. 3, 2018

(54) REDUCING SOLDER PAD TOPOLOGY DIFFERENCES BY PLANARIZATION

(71) Applicant: Lumileds LLC, San Jose, CA (US)

(72) Inventors: Jipu Lei, San Jose, CA (US); Stefano Schiaffino, San Jose, CA (US); Alexander H. Nickel, San Jose, CA (US); Mooi Guan Ng, San Jose, CA (US); Salman Akram, San Jose, CA (US)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 14/392,345

(22) PCT Filed: Jun. 5, 2014

(86) PCT No.: PCT/IB2014/061968
§ 371 (c)(1),
(2) Date: Dec. 23, 2015

(87) PCT Pub. No.: WO2014/207590
PCT Pub. Date: Dec. 31, 2014

(65) Prior Publication Data
US 2016/0181216 A1      Jun. 23, 2016

Related U.S. Application Data

(60) Provisional application No. 61/838,457, filed on Jun. 24, 2013.

(51) Int. Cl.
*H01L 23/00*     (2006.01)
*B23K 1/20*      (2006.01)
(Continued)

(52) U.S. Cl.
CPC ............... *H01L 24/11* (2013.01); *B23K 1/20* (2013.01); *H01L 21/4853* (2013.01);
(Continued)

(58) Field of Classification Search
CPC ......... H01L 24/11; H01L 24/03; H01L 24/06; H01L 24/14; H01L 24/81;
(Continued)

(56) References Cited

U.S. PATENT DOCUMENTS 6,660,944 B1    12/2003   Murata et al.
6,746,317 B2     6/2004   Blalock
(Continued)

FOREIGN PATENT DOCUMENTS

| EP | 0797247 A1 | 9/1997 |
|---|---|---|
| JP | 5235102 A2 | 9/1993 |
| JP | H05235102 A | 9/1993 |

OTHER PUBLICATIONS

US 5,901,437, 05/1999, Variot et al. (withdrawn)
(Continued)

*Primary Examiner* — Michael Trinh
(74) *Attorney, Agent, or Firm* — Volpe and Koenig, P.C.

(57) ABSTRACT

A technique is disclosed for causing the top surfaces of solder bumps on a chip to be in the same plane to ensure a more reliable bond between the chip and a substrate. The chip is provided with solder pads that may have different heights. A dielectric layer is formed between the solder pads. A relatively thick metal layer is plated over the solder pads. The metal layer is planarized to cause the top surfaces of the metal layer portions over the solder pads to be in the same plane and above the dielectric layer. A substantially uniformly thin layer of solder is deposited over the planarized metal layer portions so that the top surfaces of the solder bumps are substantially in the same plane. The chip is then positioned over a substrate having corresponding metal pads, and the solder is reflowed or ultrasonically bonded to the substrate pads.

11 Claims, 4 Drawing Sheets

(51) Int. Cl.
*H01L 21/48* (2006.01)
*H01L 23/498* (2006.01)

(52) U.S. Cl.
CPC ........ *H01L 23/49816* (2013.01); *H01L 24/06* (2013.01); *H01L 24/13* (2013.01); *H01L 24/14* (2013.01); *H01L 24/16* (2013.01); *H01L 24/81* (2013.01); *H01L 24/03* (2013.01); *H01L 24/94* (2013.01); *H01L 2224/0345* (2013.01); *H01L 2224/03614* (2013.01); *H01L 2224/03912* (2013.01); *H01L 2224/0401* (2013.01); *H01L 2224/05647* (2013.01); *H01L 2224/0603* (2013.01); *H01L 2224/06102* (2013.01); *H01L 2224/119* (2013.01); *H01L 2224/1147* (2013.01); *H01L 2224/1182* (2013.01); *H01L 2224/1184* (2013.01); *H01L 2224/11462* (2013.01); *H01L 2224/11464* (2013.01); *H01L 2224/11825* (2013.01); *H01L 2224/11826* (2013.01); *H01L 2224/11845* (2013.01); *H01L 2224/11902* (2013.01); *H01L 2224/136* (2013.01); *H01L 2224/13017* (2013.01); *H01L 2224/13022* (2013.01); *H01L 2224/13147* (2013.01); *H01L 2224/13564* (2013.01); *H01L 2224/13582* (2013.01); *H01L 2224/13611* (2013.01); *H01L 2224/13639* (2013.01); *H01L 2224/13644* (2013.01); *H01L 2224/13655* (2013.01); *H01L 2224/1403* (2013.01); *H01L 2224/14051* (2013.01); *H01L 2224/14104* (2013.01); *H01L 2224/16145* (2013.01); *H01L 2224/16225* (2013.01); *H01L 2224/16227* (2013.01); *H01L 2224/81205* (2013.01); *H01L 2224/81801* (2013.01); *H01L 2224/81815* (2013.01); *H01L 2224/94* (2013.01); *H01L 2924/12041* (2013.01)

(58) Field of Classification Search
CPC ... H01L 2224/0401; H01L 2224/11462; H01L 2224/14104; H01L 2224/0603; H01L 2224/06102; H01L 2224/06051; H01L 2224/1146; H01L 2224/11464; H01L 2224/11845
See application file for complete search history.

(56) References Cited

U.S. PATENT DOCUMENTS

| | | | |
|---|---|---|---|
| 7,008,867 B2* | 3/2006 | Lei | H01L 24/03 257/E21.508 |
| 8,405,213 B2* | 3/2013 | Chen | H01L 25/16 257/685 |
| 2002/0052065 A1* | 5/2002 | Ogura | H01L 21/76885 438/128 |
| 2004/0082161 A1 | 4/2004 | Ho et al. | |
| 2008/0217183 A1* | 9/2008 | Muthukumar | B23H 5/08 205/123 |
| 2009/0152100 A1* | 6/2009 | Dalal | C23C 14/022 204/192.15 |
| 2010/0013094 A1 | 1/2010 | Jo et al. | |
| 2012/0025242 A1* | 2/2012 | Zeng | H01L 33/486 257/98 |
| 2012/0280385 A1 | 11/2012 | Tain et al. | |

OTHER PUBLICATIONS

EPO as ISA, PCT/IB2014/061968, filed Jun. 5, 2014, "International Search Report and Written Opinion" dated Feb. 19, 2015, 31 pages.

* cited by examiner

REDUCING SOLDER PAD TOPOLOGY DIFFERENCES BY PLANARIZATION

CROSS REFERENCE TO RELATED APPLICATIONS

The present application is a § 371 application of International Application No. PCT/IB 2014/061969 filed on Jun. 5, 2014 and entitled "Reducing Solder Pad Topology Difference by Planarization," which claims the benefit of U.S. Provisional Application Ser. No. 61/838,457, filed Jun. 24, 2013. Both PCT/IB2014/61968 and U.S. 61/838,457 are incorporated herein.

FIELD OF THE INVENTION

This invention relates to solder-bonding a chip to a substrate and, in particular, to a technique for improving the reliability of solder connections between pads on the chip and pads on the substrate.

BACKGROUND

It is common to provide metal pads on a chip, such as a semiconductor chip or a ceramic submount, then deposit solder bumps on the pads. The pads may have different heights due to a varying thickness of the chip or due to the pads having varying thicknesses. The chip is then positioned over a larger substrate containing corresponding metal pads, and the solder bumps are reflowed to bond the opposing pads together to form electrical connections between the chip and the substrate.

Solder bumps may have heights between tens of microns to hundreds of microns. These dimensions are typically many times greater than the differences in heights of the pads on the chip so, during reflow, there is a sufficient volume of solder on each pad to bridge across any gap to an opposing pad on the substrate. Additionally, the sizes of the solder bumps themselves vary somewhat, and the relatively large volume of solder is sufficient to bridge across any gap to an opposing pad on the substrate.

However, for very small chip pads or for pads that are very close together, less solder must be used. There is a point where the small volume of solder on each pad is not sufficient to bridge a gap between a solder bump and the opposing pad during reflow due to the difference in heights of the pads on the chip being too great. Therefore, the size of the pads and/or their pitch is limited.

FIGS. 1A-1C and FIGS. 2A and 2B illustrate the problem with an insufficient size solder bump used with pads having differences in heights.

In FIG. 1A, a chip 10 is shown that may be a semiconductor chip, a ceramic submount, or other chip that may benefit from small solder bumps. The chip 10 has a small metal solder pad 12 and a small solder area 14 lower in height than the solder pad 12. The chip 10 may have an array of such pads 12 or areas 14. The area 14 represents any solder attachment area (which may also be another metal pad) that has a lower height than the pad 12. Small solder bumps 16 and 18 are deposited over the pad 12 and area 14 and somewhat spread out over the surface. It is assumed the volumes of the solder bumps 16 and 18 are the same. If the pad 12 or area 14 were larger, the solder bumps 16 and 18 may resemble a sphere due to the surface tension of the solder.

The solder bumps in all embodiments may be conventional such as tin, lead, silver, gold, nickel, other metals and alloys thereof.

In FIG. 1B, the chip 10 is positioned over a substrate 20. Note how the solder bump 16 is pressed against the opposing metal pad 22 on the substrate 20, but the solder bump 18 is slightly separated from the opposing pad 24 on the substrate 20.

In FIG. 1C, the structure of FIG. 1B is heated to reflow the solder. The solder bump 16 forms a good bond between the pads 16 and 22, but the solder bump 18 separates into two portions 18A and 18B and forms an unreliable connection between the pad 24 and the area 14. Therefore, more solder is needed and the solder pads/areas need to be larger or more separated. Thus, the pad/area height difference limits the size and/or density of the solder pads/areas.

In FIG. 2A, a chip 26 has a pad 28 and a lower height solder area 30, with a dielectric portion 32 between the pad 28 and area 30. Recessed solder bumps 34 and 36, of the same volume solder, are formed on the pad 28 and area 30.

In FIG. 2B, the chip 26 is positioned over the substrate 20. Note how the solder bump 34 is pressed against the opposing metal pad 22 on the substrate 20, but the solder bump 36 is slightly separated from the opposing pad 24 on the substrate 20.

During reflow or an ultrasonic bonding process, the solder hump 36 will not make a good connection to the opposing pad 24.

What is needed is a technique that improves the reliability of connections made using solder bumps where the heights of the solder pads or solder areas on a chip are different.

SUMMARY

In one embodiment, a chip is formed to have at least two pads having different heights. For purposes of this disclosure, a pad may include any area of the chip where a solder bump is to be deposited. The pads will typically be a patterned metal layer. A dielectric region is formed between the pads and has a height greater than the pads.

The pads are plated to form a relatively thick metal layer. The metal layer portions over the pads are not planar due to the metal overlapping the dielectric region somewhat and due to non-uniformity in the plating process. Other metal deposition techniques may also be used; however, plating may result in a finer resolution among other advantages.

A chemical-mechanical planarization (CMP) process (or other planarization process) is then performed to planarize the metal layer portions to a height somewhat above the dielectric region. The metal layer portions now form the solder pads, all in the same plane.

A uniform layer of solder is then formed over the planarized metal layer, such as by plating, screen printing, or other means. The resulting solder layers over the metal layer portion should therefore be substantially in the same plane.

If the plating was performed using a blanket seed layer and a patterned resist layer over the seed layer, the resist layer and seed layer below the resist layer are then etched away to electrically isolate the metal pads.

The resulting solder portions may then he bonded to corresponding pads of a substrate. The connections with thus have a high reliability with only a very small amount of solder. The pads may be made very small and/or very close together without the solder shorting the pads.

Frequently, the solder bumps are formed of a precious metal, such as gold The present process greatly reduces the amount of solder required for reliable interconnections, saving considerable cost.

The process may be performed on individual chips after singulation or on a wafer scale before singulation.

Various other embodiments are disclosed.

Planarizing a semiconductor wafer surface for subsequent processing of the wafer is well known and described in U.S. Pat. No. 6,746,317. The process of the present invention only planarizes the solder pads, which are at a height above the chip surface.

It is also known to planarize the solder bumps themselves, such as described in U.S. Pat. Nos. 5,901,437 and 6,660,944. However, since solder bumps have a weak bond to the pads, such planarization may dislodge. the solder bumps. Further, such planarization may laterally spread the relatively soft solder bumps and create reliability problems.

The present process avoids such drawbacks associated with the prior art.

BRIEF DESCRIPTION OF THE DRAWINGS

Elements that are the same or similar are labeled with the same numeral.

DETAILED DESCRIPTION

Generally, the invention enables the use of less solder to ensure reliable connections are made between a chip and a substrate. The invention is particularly useful where solder pads are desired to be small and/or closely spaced.

Figure 1A:
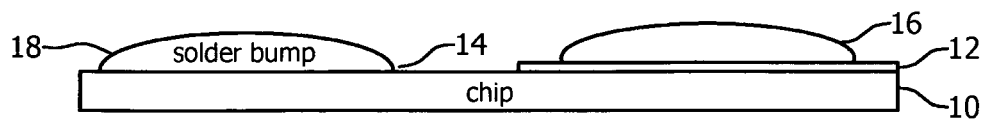
FIG. 1A is a cross-sectional simplified view of a prior art chip having solder pads or solder areas of different heights, resulting in solder bumps having different heights.
Figure 1B:
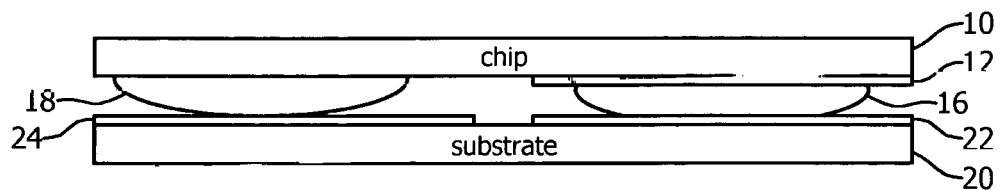
FIG. 1B illustrates the chip of FIG. 1A being positioned over a substrate.
Figure 1C:
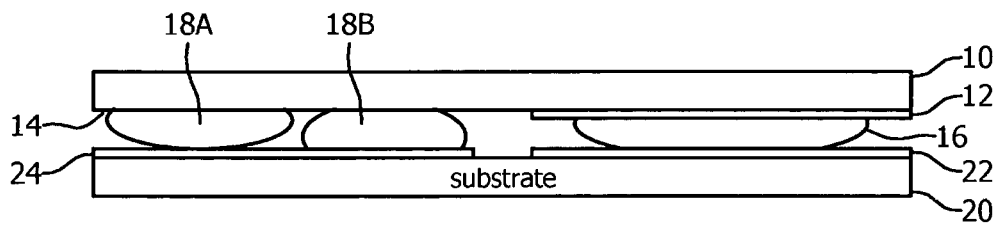
FIG. 1C illustrates the structure of FIG. 1B after reflow, resulting in low reliability electrical connections due to the different heights of the solder bumps.
Figure 2A:
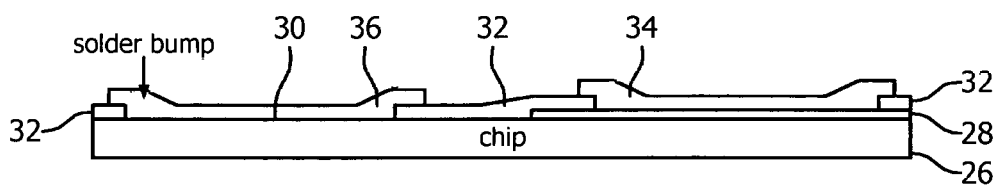
FIG. 2A is a cross-sectional simplified view of a prior art chip having solder pads or solder areas of different heights, resulting in recessed solder bumps having different heights.
Figure 2B:
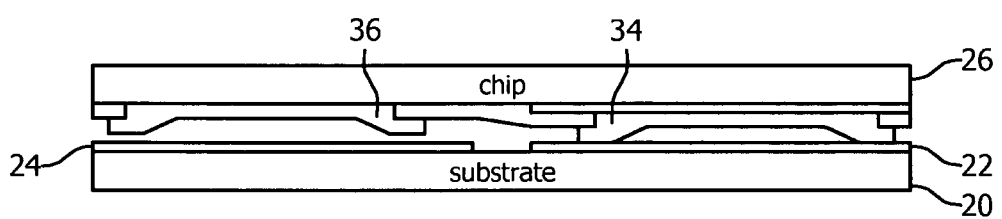
FIG. 2B illustrates the chip of FIG. 2A positioned on a substrate, resulting in low reliability electrical connections due to the different heights of the solder bumps.
Figure 3:
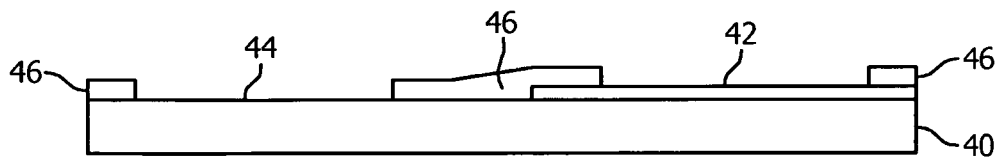
FIG. 3 illustrates a simplified topology of a chip where the solder pads or solder areas have different heights, and where a dielectric portion is formed between the solder pads/areas.

FIG. 3 illustrates a chip 40 that may be any electronic device, such as a flip chip light emitting diode (LED), an integrated circuit, a ceramic submount, an interposer, etc.

A solder pad 42 is formed on the chip 40. The pad 42 may be a metal layer contacting a semiconductor region or the pad 42 may itself be a semiconductor layer. An area 44 is also shown, which may be another metal pad or semiconductor region where a metal connection is required. Pad 42 and area 44 are an exemplary embodiment which includes two different starting heights of areas where a solder interconnection is to be made. Both the pad 42 and area 44 may be metal layers having different heights. The difference in heights may only be a few microns.

The pads 42 and area 44 may be electrically connected to semiconductor regions or other circuitry in or on the chip 40.

Patterned dielectric layer 46 is formed between the pad 42 and area 44 as well as over other areas that are to be protected.

Figure 4:
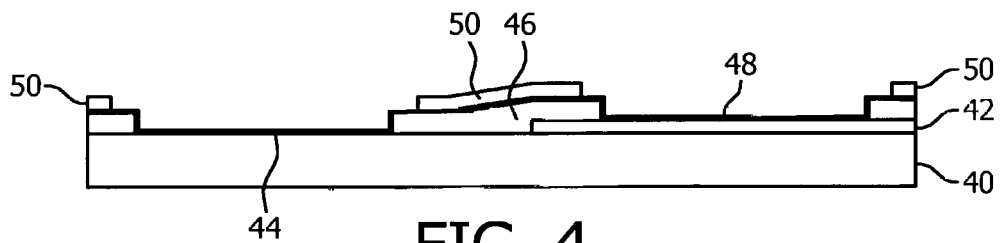
FIG. 4 illustrates a metal seed layer blanket-deposited and a patterned resist layer formed over portions that are not to be plated.

In FIG. 4, a metal seed layer 48 is deposited over the surface of the chip 40 such as by sputtering. The seed layer 48 may be the same metal that will be plated over the seed layer, such as copper or other suitable material, or may be a different conductive material.

If the plating process requires applying a potential to all of the plated areas, the seed layer 48 provides the conducting surface at the desired potential.

A patterned resist layer 50 is formed over the portions of the seed layer 48 that are not to be plated.

Figure 5:
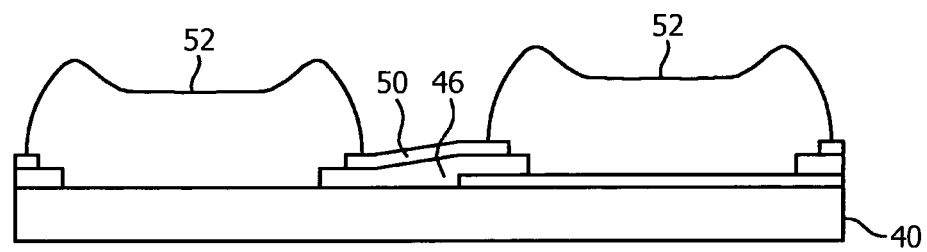
FIG. 5 illustrates the chip after a plating process.

In FIG. 5, a potential is coupled to the seed layer 48, such as at an edge of the chip, and the chip is immersed in a plating solution. A copper electrode (or other metal to be deposited) is also immersed in the plating solution and the copper atoms migrate to the seed layer 48 to form a relatively thick plating layer 52. Layer 52 may be more than 10 microns thick. Electroless plating may also be used. The plating technique used may be conventional and need not be described in detail. A wide variety of metals may be deposited. The seed layer is no longer shown since it is assumed to be merged with the plating layer 52.

The plating layer 52 extends over the dielectric layer 46 somewhat since the seed layer 48 is exposed around the edges of the dielectric layer 46. The plating layer 52 may be an irregular or a mushroom shape. The plating layer 52 may have higher and lower points relative to the surface of chip 40. In the alternative, plating layer 52 may be relatively smooth, but will still have a lowest point relative to chip 40.

Figure 6:
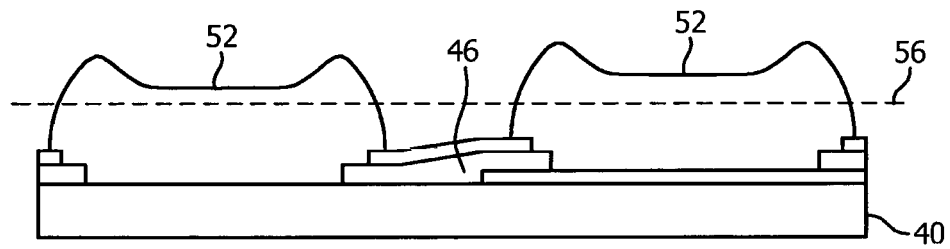
FIG. 6 illustrates the chip with the planarization target as a dashed line.

FIG. 6 illustrates a target planarization line 56 somewhat below the lowest point of the plating layer 52. The planarization line 56 may be even with the dielectric layer 46 or above it.

Figure 7:
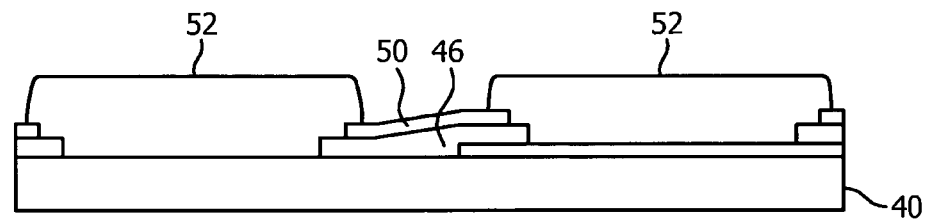
FIG. 7 illustrates the chip after planarization to planarize the metal pads so their top surfaces are in the same plane.

In FIG. 7, a CMP process, or other planarization process, is performed to planarize the plating layer 52 to the planarization line 56 (FIG. 6). Note that the plating layer 52 still extends above the resist layer 50 so that the planarization only planarizes only one material. The top surfaces of all the plating layer portions are now in the same plane.

Figure 8:
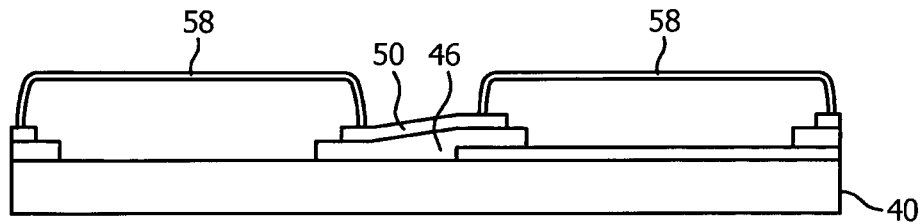
FIG. 8 illustrates a uniform layer of solder deposited over the metal pads.

In FIG. 8, a relatively thin and uniform solder layer 58 is deposited over the planarized plating layer 52 so that the top surface of the solder layer 58 over each pad 12 and area 14 is substantially planar. The solder layer 58 may be deposited by screen printing, plating, sputtering, or other suitable method. The solder layer 58 may be any conventional metal or metal combination, such as gold, tin, silver, nickel, or other metals and alloys thereof. The solder layer 58 may be made very thin due to the planar surface of the plating layer 52. This results in substantial cost savings if the solder is a precious metal. One or more interface layers may be deposited between the plating layer 52 and the solder layer 58 such as for improved wetting or bonding to the plating layer 52.

Figure 9:
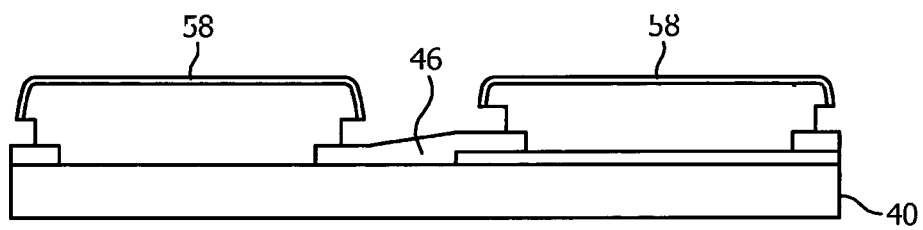
FIG. 9 illustrates the resist removal and seed layer etch back.

In FIG. 9, the resist layer 50 and exposed seed layer 48 are etched away to electrically isolate the solder layer 58 over each plating layer 52 portion. Typically, the etch is a chemical etch.

Figure 10:
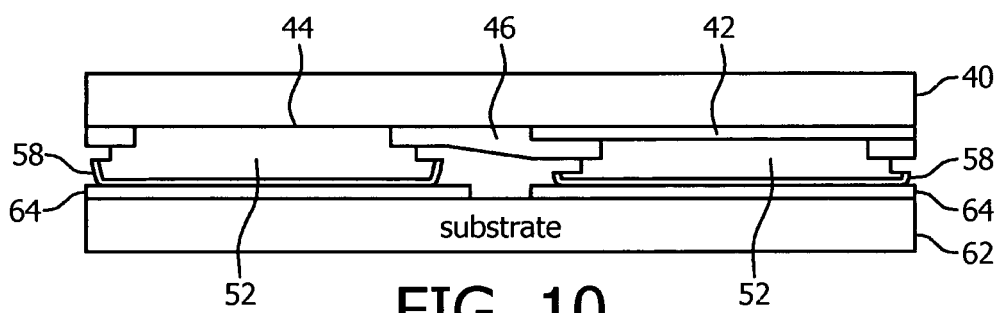
FIG. 10 illustrates the resulting chip positioned over a substrate, where the solder over all pads either touches the corresponding pads on the substrate or is separated by an insubstantial distance so that the reflow process causes the solder to form a reliable bond between the opposing pads.

FIG. 10 illustrates the resulting chip 40 positioned over a substrate 62, where the solder layer 58 either touches the corresponding metal pads 64 on the substrate 62 or is separated by an insubstantial distance so that the reflow process causes the solder layer 58 to form a reliable bond between the opposing pads. The substrate 62 may be a printed circuit board, a submount, another chip, an interposer, or any other type of substrate.

If an ultrasonic bond process is used, the pressure of the bonding process pushes the solder layer 58 against the pads 64 while softening and fusing the solder layer 58 to the pads 64. Therefore, there will be a reliable connection between all the solder layer 58 portions and the pads 64.

Figure 11:
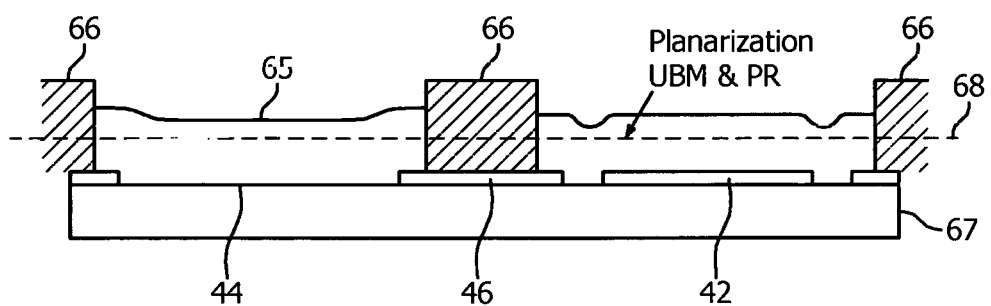
FIG. 11 illustrates how the plated metal layer may be formed lower than the resist layer, so both the metal layer and the resist layer are subsequently planarized.

FIG. 11 illustrates how the plated metal layer 65 may be formed lower than the resist layer 66 on the chip 67, so both the metal layer 65 and the resist layer 66 are subsequently planarized during the same planarization process. The target planarization line 68 is shown.

Figure 12:
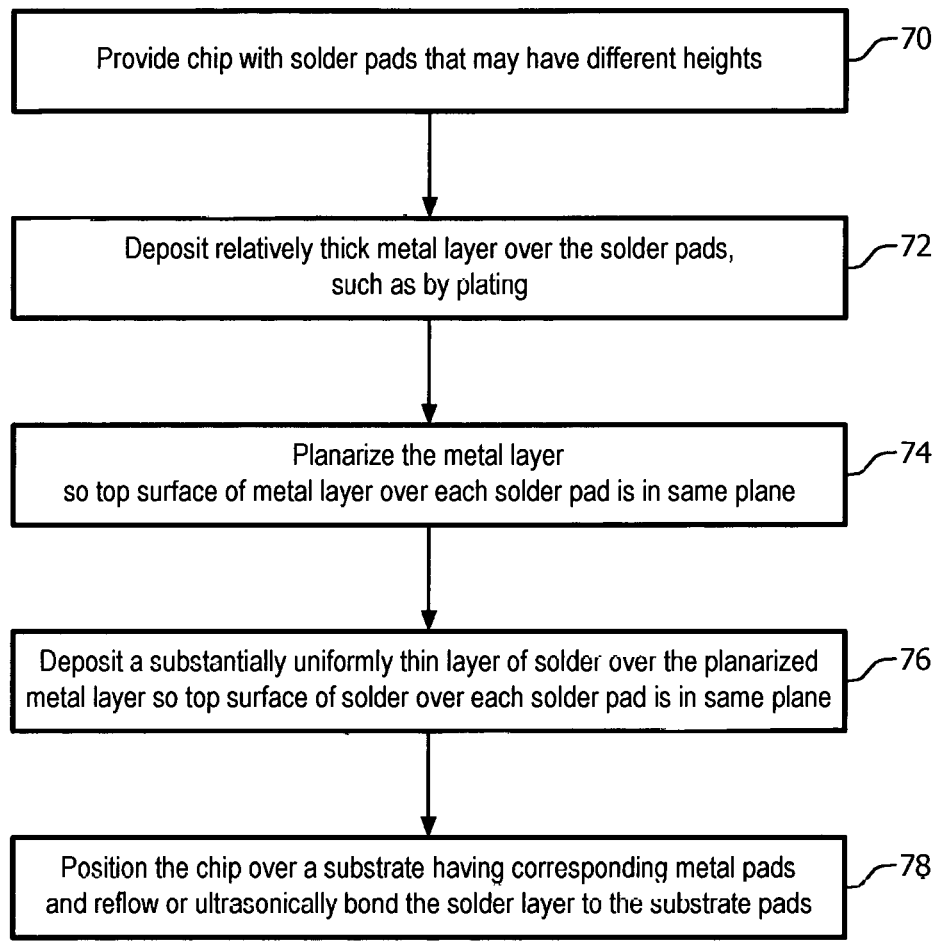
FIG. 12 is a flowchart identifying various steps that may be used in one embodiment of the invention.

FIG. 12 is a flowchart identifying various steps that may be used in one embodiment of the invention.

In step 70, a chip is provided with solder pads that may have different heights.

In step 72, a relatively thick metal layer is deposited over the solder pads, such as by plating.

In step 74, the metal layer is planarized so that the top surface of the metal layer over each pad is in the same plane. In one embodiment, the plane of the metal layer over each pad is at an angle relative to a plane of the first surface.

In step 76, a substantially uniformly thin layer of solder is deposited over the planarized metal layer so the top surface of the solder over each pad is in the same plane.

In step 78, the chip is positioned over a substrate having corresponding metal pads, and the solder is reflowed or ultrasonically bonded to the substrate pads.

The present invention may be performed on a wafer scale prior to the chips being singulated or performed after the chips are singulated.

The present invention is applicable to improving solder connections between any two opposing surfaces having solder pads and is not limited to chips.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method comprising:
   providing an electronic device with a first surface and a second surface opposite the first surface;
   providing a first solder pad at a first distance above the first surface and a second solder pad at second distance above the first surface, the first distance being different from the second distance;
   providing a dielectric layer between the first solder pad and the second solder pad;
   after the step of providing the dielectric layer, plating a first metal layer portion over the first solder pad above a height of the dielectric layer so that, immediately after the step of plating, the first metal layer portion extends above any insulating material;
   after the step of providing the dielectric layer, plating a second metal layer portion, concurrently with plating the first metal layer portion, over the second solder pad above the height of the dielectric layer so that, immediately after the step of plating, the second metal layer portion extends above any insulating material;
   planarizing the first metal layer portion and the second metal layer portion, so that the step of planarizing planarizes only the material forming the first metal layer portion and the second metal layer portion, resulting in the first metal layer and the second metal layer having a third and a fourth surface respectively, wherein the third surface and the fourth surface are in the same plane and still have a height above the height of the dielectric layer,
   depositing a first solder layer over the first metal layer portion; and
   depositing a second solder layer over the second metal layer portion, such that a top surface of the first solder layer is in the same plane as a top surface of the second solder layer.

2. The method of claim 1:
   wherein the plated first metal portion has a fifth surface connected to the first solder pad and a sixth surface opposite the fifth surface,
   wherein the plated second metal portion has a seventh surface connected to the second solder pad and an eight surface opposite the seventh surface, and
   wherein the dielectric layer is closer to the first surface than any point of the sixth and eight surfaces.

3. The method of claim 1 wherein the electronic device is a chip after singulation from a wafer.

4. The method of claim 3 further comprising:
   positioning the chip with respect to a substrate having a third solder pad corresponding to the first solder pad and having a fourth solder pad corresponding to the second solder pad;
   bonding the first solder layer to the third solder pad; and
   bonding the second solder layer to the fourth solder pad.

5. The method of claim 4 wherein bonding the first solder layer to the third solder pad and bonding the second solder layer to the fourth solder pad are by solder reflow.

6. The method of claim 4 wherein bonding the first solder layer to the third solder pad and bonding the second solder layer to the fourth solder pad are by ultrasonic bonding.

7. The method of claim 1:
   wherein planarizing the first metal layer portion and the second metal layer portion comprises planarizing the first metal layer portion and the second metal layer portion to be higher than the dielectric portion.

8. The method of claim 1 wherein the electronic device is a chip after singulation from a wafer, and wherein the chip is a flip chip light emitting diode.

9. The method of claim 1 wherein the electronic device is a chip after singulation from a wafer, and wherein the chip is an integrated circuit.

10. The method of claim 1 wherein the plane is parallel to the first surface.

11. The method of claim 1 wherein the first surface of the electronic device forms a first plane, and wherein the plane of the top surface of the first solder layer and top surface of the second solder layer form a second plane that is not parallel to the first plane.

* * * * *